US012315780B2

(12) United States Patent
Miele et al.

(10) Patent No.: US 12,315,780 B2
(45) Date of Patent: May 27, 2025

(54) TECHNOLOGIES FOR PROCESSOR LOADING MECHANISMS

(71) Applicant: Intel Corporation, Santa Clara, CA (US)

(72) Inventors: Ralph V. Miele, Hillsboro, OR (US); Phil Geng, Washougal, WA (US); Mengqi Liu, Hillsboro, OR (US); David Shia, Portland, OR (US); Sandeep Ahuja, Portland, OR (US); Eric W. Buddrius, Hillsboro, OR (US); Jeffory L. Smalley, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 946 days.

(21) Appl. No.: 17/187,470

(22) Filed: Feb. 26, 2021

(65) Prior Publication Data

US 2021/0193558 A1  Jun. 24, 2021

(51) Int. Cl.
*H01L 23/40* (2006.01)
*G06F 1/18* (2006.01)
(Continued)

(52) U.S. Cl.
CPC .. *H01L 23/4006* (2013.01); *H01L 2023/4068* (2013.01); *H01L 2023/4081* (2013.01); *H01L 2023/4087* (2013.01)

(58) Field of Classification Search
CPC ......... H01L 23/4006; H01L 2023/4068; H01L 2023/4081; H01L 2023/4087;
(Continued)

(56) References Cited

U.S. PATENT DOCUMENTS 6,330,745 B1  12/2001  Cromwell et al.
6,449,162 B1   9/2002  Corbin, Jr. et al.
(Continued)

FOREIGN PATENT DOCUMENTS

CN      111124069 A     5/2020

OTHER PUBLICATIONS

International Searching Authority, "International Preliminary Report on Patentability," issued in connection with International Patent Application No. PCT/US2022/013499, issued on Aug. 29, 2023, 7 pages.
(Continued)

*Primary Examiner* — Yara B Green
*Assistant Examiner* — Akhee Sarker-Nag
(74) *Attorney, Agent, or Firm* — HANLEY, FLIGHT & ZIMMERMAN, LLC

(57) ABSTRACT

Techniques for processor loading mechanisms are disclosed. In the illustrative embodiment, a heat sink is in contact with a top surface of a processor, applying a downward force on the processor. A load plate is also in contact with the processor, applying a downward force to the processor as well. The combination of the downward force from the load plate and the heat sink keep the processor in good physical contact with pins of the processor socket. The heat sink has enough force applied to the processor to be in good thermal contact with the processor without applying higher stress to the heat sink. The load plate can apply force to the processor without regard to the thermal characteristics of the load plate. Other embodiments are envisioned and described.

10 Claims, 11 Drawing Sheets

(51) Int. Cl.
  *G06F 1/20* (2006.01)
  *H01L 23/367* (2006.01)
  *H05K 7/20* (2006.01)

(58) Field of Classification Search
  CPC ....... H01L 23/3672; G06F 1/183; G06F 1/20; H05K 7/2049; H05K 7/20709
  See application file for complete search history.

(56) References Cited

U.S. PATENT DOCUMENTS

| | | |
|---|---|---|
| 2004/0084764 A1 | 5/2004 | Ishimine et al. |
| 2004/0247925 A1* | 12/2004 | Cromwell ............ H05K 7/1061 257/E23.101 |
| 2005/0108877 A1 | 5/2005 | Peterson |
| 2019/0393631 A1* | 12/2019 | Haswarey ................. G06F 1/20 |
| 2020/0126889 A1* | 4/2020 | Mao ...................... H01L 23/427 |
| 2020/0328135 A1 | 10/2020 | Terhune, IV |

OTHER PUBLICATIONS

PCT International Search Report and Written Opinion issued in PCT/US2022/013499, dated May 9, 2022; 11 pages.

Geng, Phil; "Structural Design of Land Grid Array Loading Mechanisms for Intel Central Processor Unit Stack Retention," Journal of Electronic Packaging, vol. 141; Mar. 2019; 8 pages.

European Patent Office, "Extended European Search Report," issued in connection with European Patent Application No. 22760179.6, dated Nov. 20, 2024, 9 pages.

* cited by examiner

TECHNOLOGIES FOR PROCESSOR LOADING MECHANISMS

BACKGROUND

A compute device may include a processor positioned in a processor socket on a mainboard. The processor typically requires a heat sink to absorb and disperse heat generated in the processor. The processor has pins connecting the processor to the processor socket. When the processor is positioned in the processor socket, a force must be applied to keep the processor in contact with each of the pins. For a higher number of pins, a higher force may be required. In order to keep the processor in contact with the pins of the processor socket, the heat sink can be fastened to the mainboard and press down on the processor.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
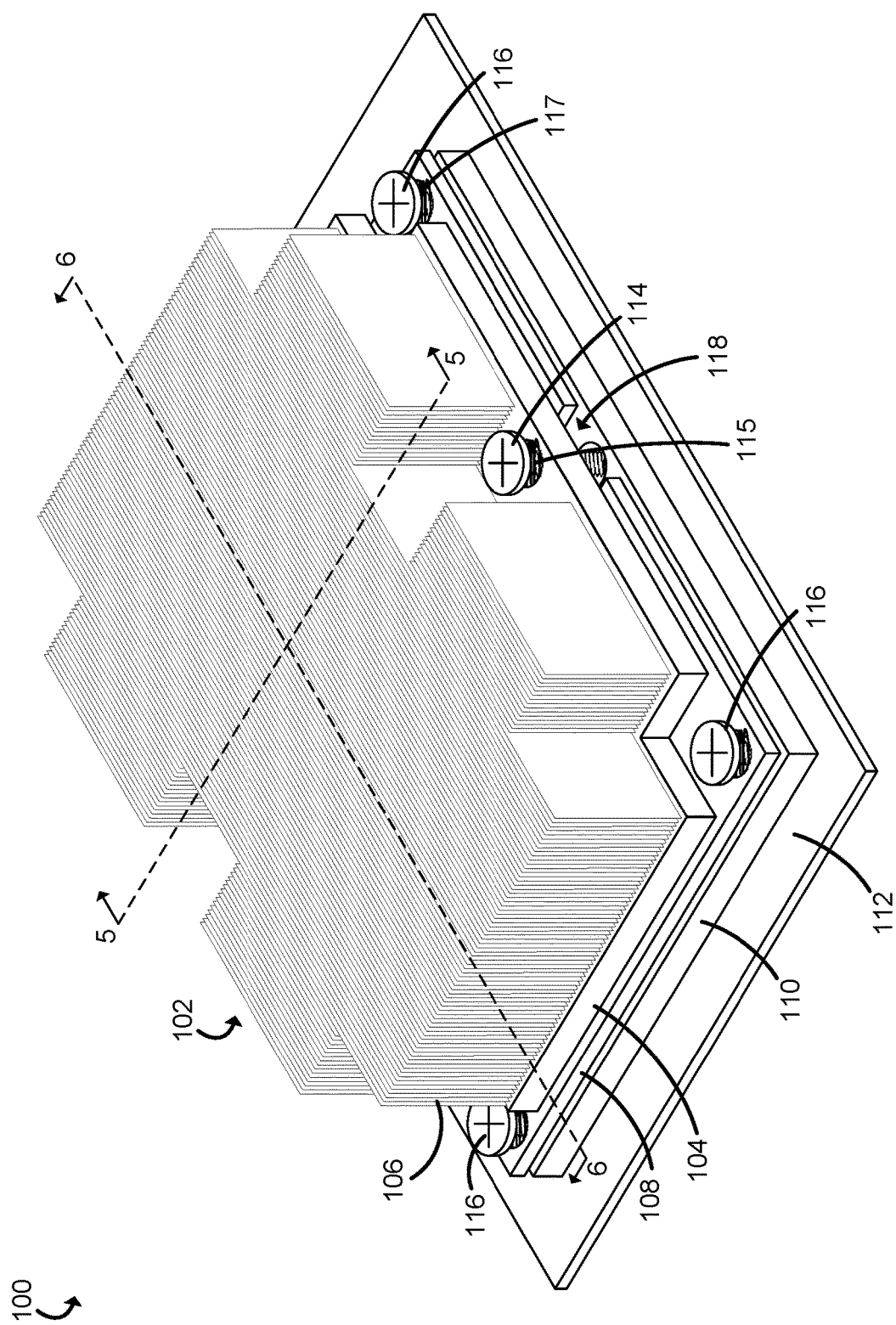
FIG. 1 is a perspective view of a simplified diagram of at least one embodiment of a system with an integrated circuit component and heat sink connected to a system board.

For processors and other integrated circuit components with a large number of pins, a large force may be required to keep the processor in contact with all of the pins. That force may be applied to the heat sink by one or more fasteners, which then transfers the force to the processor. However, in some cases, the force applied to the heat sink may cause uneven loading on the processor or damage to the heat sink, causing reduced performance over time. For example, in one embodiment, heat sink fins may be adhered (e.g., soldered) to a base of a heatsink. With a high force applied to the edges or corners of the heatsink, the heat sink fins may delaminate from the heatsink, reducing the effective heat dissipation of the heat sink. In another embodiment, the base of the heat sink may warp over time under the stress of the force applied to it, redistributing the force applied to the processor away from the center and towards the edges.

In order to possibly address those drawbacks, in one embodiment, the force applied to the processor to keep it in contact with the processor socket can be split between a heat sink and a load plate. The force can be split between the heat sink and the load plate in any suitable manner, such as the specific embodiments described below in more detail.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. The term "coupled," "connected," and "associated" may indicate elements electrically, electromagnetically, thermally, and/or physically (e.g., mechanically or chemically) co-operate or interact with each other, and do not exclude the presence of intermediate elements between the coupled, connected, or associated items absent specific contrary language. Terms modified by the word "substantially" include arrangements, orientations, spacings, or positions that vary slightly from the meaning of the unmodified term. For example, surfaces described as being substantially parallel to each other may be off of being parallel with each other by a few degrees.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, wherein similar or same numbers may be used to designate same or similar parts in different figures. The use of similar or same numbers in different figures does not mean all figures including similar or same numbers constitute a single or same embodiment. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form to facilitate a description thereof. The intention is to cover all modifications, equivalents, and alternatives within the scope of the claims.

Figure 2:
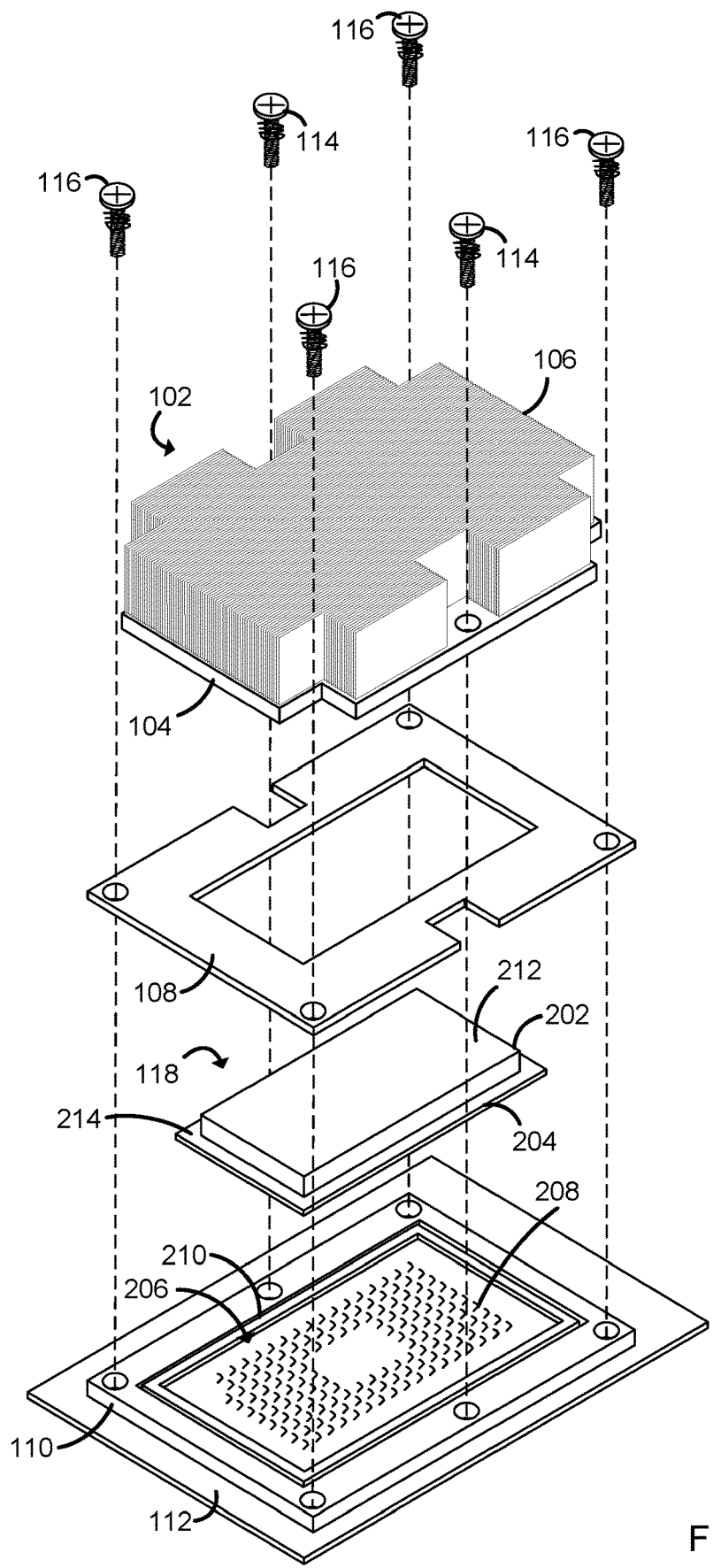
FIG. 2 is an exploded perspective view of simplified diagram of at least one embodiment of the system of FIG. 1.
Figure 3:
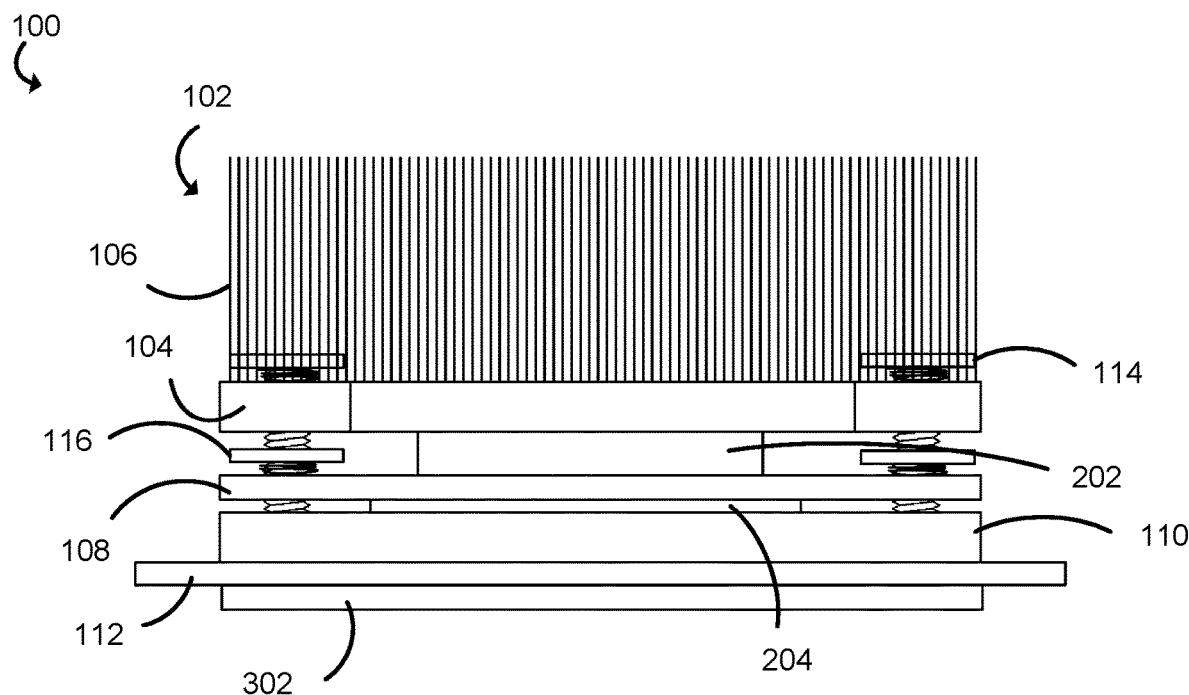
FIG. 3 is a side view of the system of FIG. 1.
Figure 4:
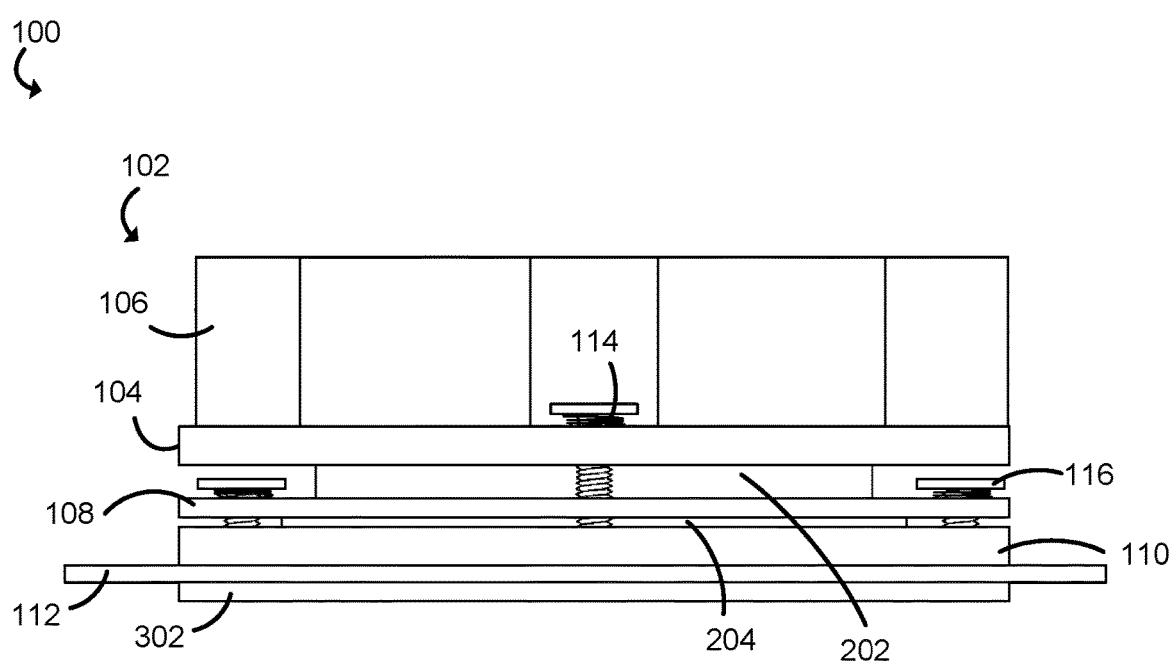
FIG. 4 is a front view of the system of FIG. 1.
Figure 5:
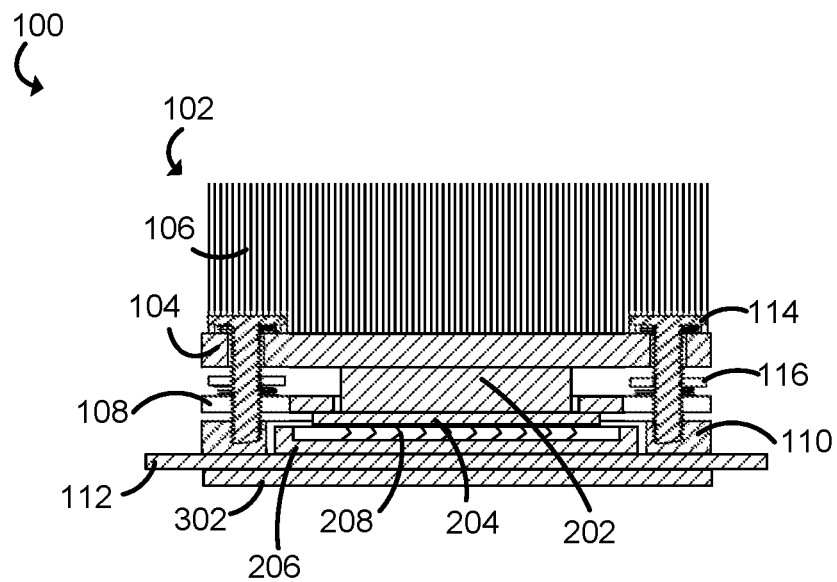
FIG. 5 is a cross-sectional view of the system of FIG. 1.
Figure 6:
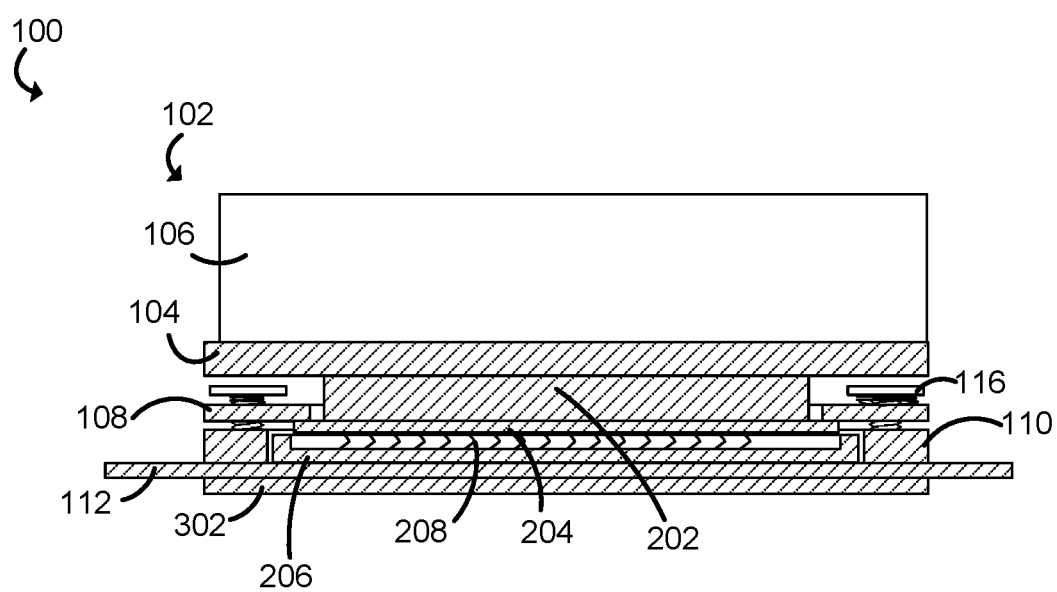
FIG. 6 is a cross-sectional view of the system of FIG. 1.

Referring now to FIG. 1, an illustrative system 100 with a heat sink module attached to a system board includes a heat sink 102, a load plate 108, an integrated circuit component 118 (not visible in FIG. 1), a bolster plate 110, and the system board 112. FIG. 2 shows an exploded view of the components of FIG. 1. As shown in FIG. 2, the integrated circuit component 118 includes an integrated heat spreader (IHS) 202 mounted on a substrate 204. The integrated circuit component 118 is configured to mate with a processor socket 206, which includes several pins 208. FIG. 3 shows a front view of the system 100, and FIG. 4 shows a side view of the system 100. FIG. 5 corresponds to the cross-section 5 shown in FIG. 1. FIG. 5 shows a cross-sectional view of the system 100 along a long axis of the system 100. FIG. 6 corresponds to the cross-section 6 shown in FIG. 1. FIG. 6 shows a cross-sectional view of the compute system along a short axis of the system 100.

In the illustrative embodiment, the heat sink 102 is fastened to the bolster plate 110 by two fasteners 114. The heat sink 102 contacts the top of the IHS 202, applying a downward force on the integrated circuit component 118 towards the processor socket 206. The illustrative load plate 108 is fastened to the bolster plate 110 by four fasteners 116. The load plate 108 contacts the integrated circuit component 118, applying a downward force on the integrated circuit component 118 in the same direction as the heat sink 102. In the illustrative embodiment, the load plate 108 contacts the substrate 204 to apply the downward force.

The heat sink 102 and the load plate 108 may apply any suitable force to the integrated circuit component 118. In the illustrative embodiment, the heat sink 102 and the load plate 108 apply a force of about 300 pounds. In other embodiments, the heat sink 102 and the load plate 108 together may apply, e.g., 50-1,000 pounds of force. In some embodiments, the heat sink 102 and the load plate 108 may apply a force proportional to the number of pins 208. For example, the heat sink 102 and the load plate 108 may apply 10-15 grams of force (0.022 pounds of force) per pin 208. The force applied may be split in any suitable amount between the heat sink 102 and the load plate 108. For example, the heat sink 102 may apply 1-90% of the combined force applied by the heat sink 102 and the load plate 108.

It should be appreciated that splitting the forces applied to the integrated circuit component 118 between the illustrative heat sink 102 and the illustrative load plate 108 can have several benefits. In order to absorb heat from the integrated circuit component 118, the illustrative heat sink 102 needs to be strongly thermally coupled to the IHS 202 but does not necessarily need to apply a large force to the IHS 202 to do so. As such, the heat sink 102 can be fastened to the bolster plate 110 in such a way as to ensure strong thermal coupling without applying unnecessarily high forces to the heat sink 102. The reduced forces on the heat sink 102 can reduce or eliminate concerns of the heat sink fins 106 delaminating from the heat sink base 104. Additionally, the heat sink base 104 can be designed for improved thermal performance by not having to meet design requirements to withstand the stresses caused by large forces applied to the heat sink 102. For example, the heat sink base 104 can be, e.g., a relatively thin piece of high-thermal-conductivity material such as aluminum or copper rather than a relatively thicker piece of high-thermal-conductivity material or a higher-strength material with a lower thermal conductivity. In contrast, the illustrative load plate 108 can be designed to withstand a high force being applied, without the designed having to consider thermal characteristics as a significant design criterion. As a result, the heat sink 102 can be made of a relatively high-thermal-conductivity and low-strength material while the load plate 108 can be made of a relatively low-thermal-conductivity and high-strength material.

The illustrative heat sink 102 has a heat sink base 104 and several heat sink fins 106. The fins 106 may be any suitable structure that has a high surface area-to-volume ratio. The fins 106 may be any suitable shape, such as a plane, a rod, a folded sheet, etc. In the illustrative embodiment, the heat sink fins 106 are bonded to the heat sink base 104 by solder, glue, or other adhesive. In other embodiments, the heat sink fins 106 may be removably fastened to the heat sink base 104. In some embodiments, the heat sink 102 may be a unitary piece that includes both the heat sink base 104 and the heat sink fins 106. More generally, the heat sink 102 may be manufactured in any suitable manner, such as extrusion, skiving, stamping, forging, machining, 3D printing, etc.

One purpose of the heat sink 102 is to absorb heat from the integrated circuit component 118 and transfer the heat to air. In some embodiments, a fan (not shown in FIGS. 1 & 2) may blow air onto and/or through the heat sink fins 106. In the illustrative embodiment, a layer of thermal interface material (TIM) is positioned between the IHS 202 and the heat sink base 104. The TIM may be any suitable material, such as a silver thermal compound.

The heat sink 102 may be made from any suitable material. In the illustrative embodiment, the heat sink base 104 and the heat sink fins 106 are made from a high-thermal-conductivity material, such as copper, aluminum, or another material with a thermal conductivity greater than 100 W/(m×K). In some embodiments, the heat sink base 104 and the heat sink fins 106 may be made of different material. For example, the heat sink base 104 may be aluminum and the heat sink fins 106 may be copper. In some embodiments, the heat sink base 104 may have more than one layer of different materials.

The heat sink 102 may have any suitable shape or dimensions. For example, the heat sink 102 may have a width of 10-250 millimeters, a length of 10-250 millimeters, and/or a height of 10-100 millimeters. In the illustrative embodiment, the heat sink 102 has a width of about 75 millimeters, a width of about 150 millimeters, and a height of about 30 millimeters. The thickness of the base plate 104 may be any suitable thickness, such as 1-10 millimeters. In the illustrative embodiment, the base plate 104 has a thickness of about 5 millimeters. The height of the fins 106 may be any suitable height, such as 5-100 millimeters. In some embodiments, the heat sink 102 may be a cold plate used in a liquid cooling system and may not have any external fins 106.

The illustrative heat sink 102 is a rectangular shape. In other embodiments, the heat sink 102 may be any suitable shape, such as a square, a circle, etc. The illustrative heat sink base 104 has a flat surface on the bottom. In the illustrative embodiment, the central region of the bottom of the heat sink base 104 contacts the flat surface of the IHS 202. Heat flows from the central region of the heat sink base 104 to the edges of the heat sink base 104 and into the fins 106. In some embodiments, the heat sink base 104 does not have a flat surface on the bottom. For example, the heat sink base 104 may have a pedestal extruding from the bottom of the heat sink base 104 that contacts some or all of the IHS 202. Such a pedestal may elevate the rest of the heat sink 102, allowing more room for other components such as the load plate 108 to be nearer to the integrated circuit component 118. In some embodiments, the heat sink 102 may include other heat-transferring components such as one or more heat pipes, a thermoelectric heater/cooler, etc.

In the illustrative embodiment, the heat sink 102 has corners cut out to accommodate fasteners 116 that are inserted into the load plate 108. In some embodiments, the heat sink 102 does not have any corners cut out to accommodate fasteners 116. For example, the dimensions of the load plate 108 may be greater than that of the heat sink 102, allowing the fasteners 116 to be inserted without interfering with the heat sink 102. Additionally or alternatively, fasteners 116 or another fastening mechanism may be used that does require a corner cut out of the heat sink 102, such as a low-profile fastener or a fastener that fastens at an angle.

The load plate 108 may be made of any suitable material. In the illustrative embodiment, the load plate 108 is made out of high-strength steel. In other embodiments, the load plate 108 may be made out of, e.g., iron, steel, aluminum, ceramic, etc. It should be appreciated that, in the illustrative embodiment, the load plate 108 does not need to absorb heat from the integrated circuit component 118. As such, a low-thermal-conductivity material may be used in the load plate, such as a material with a thermal conductivity of less than 100 W/(m×K).

The load plate 108 may have any suitable shape or dimensions. For example, the load plate 108 may have a width of 10-250 millimeters, a length of 10-250 millimeters, and/or a height of 1-100 millimeters. In the illustrative embodiment, the load plate 108 has a width of about 75 millimeters, a width of about 150 millimeters, and a height of about 3 millimeters. The illustrative load plate 108 has a hole in it that can accommodate the IHS 202, allowing the heat sink 102 to contact a surface of the IHS 202 (e.g., a top surface 212 of the IHS 202 or a surface 214 of the substrate 204). The size and shape of the hole may be any suitable size and shape, depending on the size and shape of the IHS 202. In the illustrative embodiment, the hole may have a length of, e.g., 10-240 millimeters and/or a width of 10-240 millimeters. In the illustrative embodiment, the load plate 108 has a height that is less than the IHS 202, allowing the load plate 108 to contact the substrate 204 around the IHS 202 without contacting the heat sink 102 that is sitting on top of the IHS 202. The illustrative load plate 108 has an area cut out to accommodate a fastener 114 that extends from the heat sink 102 to the bolster plate 110. In some embodiments, the load plate 108 may not have such an area cut out. For example, the heat sink base 104 can extend past the edge of the load plate 108 below it or may have a flange extending from the heat sink base 104 past the edge of the load plate 108 such that the fastener 114 does not interfere with the structure of the load plate 108.

In the illustrative embodiment, the load plate 108 forms a complete loop around the integrated circuit component 118 and applies force all around the edge of the integrated circuit component 118. In other embodiments, the load plate 108 may not form a complete loop but rather may be in the shape of a horseshoe, with one end of the load plate 108 open. In yet other embodiments, the load plate 108 may be split into two or more separate pieces. For example, the load plate 108 may be embodied as two rails that apply force to two sides of the integrated circuit component 118.

As used herein, the term "integrated circuit component" refers to a packaged or unpacked integrated circuit product. A packaged integrated circuit component comprises one or more integrated circuits. In one example, a packaged integrated circuit component contains one or more processor units and a land grid array (LGA) or pin grid array (PGA) on an exterior surface of the package. In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any of computing system component described or referenced herein, such as a processor unit (e.g., system-on-a-chip (SoC), processor cores, graphics processor unit (GPU), accelerator), I/O controller, chipset processor, memory, or network interface controller. In one embodiment, the integrated circuit component 118 is a processor unit, such as a single-core processor, a multi-core processor, a desktop processor, a server processor, a data processing unit, a central processing unit, a graphics processing unit, etc. The processor unit may include an integrated memory, such as a high-bandwidth memory. The integrated circuit component 118 may include one or more chips integrated into a multichip package (MCP).

The illustrative integrated circuit component 118 includes an IHS 202. The IHS 202 is in thermal contact with the dies of the integrated circuit component 118, either directly or through one or more intermediate layers, such as a thermal interface material (TIM). The illustrative IHS 202 is made out of nickel-plated copper. In other embodiments, the IHS 202 may be made out of or otherwise include any suitable material, such as copper, aluminum, gold, or other high-thermal-conductivity material. In some embodiments, the integrated circuit component 118 may not include an IHS. In such an embodiment, the heat sink 102 may contact the dies included in the integrated circuit component 118 without an intermediate IHS. It should be appreciated that, in those embodiments, there may still be other layers such as a TIM between the heat sink 102 and the bare integrated circuit die(s) of the integrated circuit component 118.

The illustrative IHS 202 may be any suitable size. The illustrative IHS 202 has a width of about 30 millimeters, a length of about 60 millimeters, and a height of 5 millimeters. In other embodiments, the IHS 202 may have any suitable dimensions, such as a length and/or width of 50-200 millimeters and a height of 0.5-20 millimeters.

It should be appreciated that the IHS 202 may have a shape other than the box shape shown in the figures. For example, in some embodiments, the IHS 202 may have more than one level. For example, in one embodiment, the IHS 202 may have a top surface that it to contact the heat sink 102. The IHS 202 may also have a lower tier surrounding the top surface, providing a second surface that the load plate 108 can contact without interfering with the heat sink 102.

The illustrative substrate 204 includes interconnects to connect electrical paths of the dies of the integrated circuit component 118 to the pins 208 of the processor socket 206. In the illustrative embodiment, the substrate 204 includes a land grid array with a pad corresponding to each pin 208. Each pad may be any suitable material, such as gold, copper, silver, gold-plated copper, etc. Additionally or alternatively, in some embodiments, the substrate 204 may include a pin grid array with one or more pins that mate with a corresponding pin socket in the processor socket 206 or a ball grid array. The substrate 204 may include one or more additional components, such as a capacitor, voltage regulator, etc. The illustrative substrate 204 is a fiberglass board made of glass fibers and a resin, such as FR-4. In other embodiments, the substrate 204 may be embodied as any suitable circuit board.

In the illustrative embodiment, the substrate 204 has larger dimensions that the IHS 202 and/or the dies mounted on the substrate 204. As such, the substrate 204 can be contacted by the load plate 108 to apply a downward force to the integrated circuit component 118 without interfering with the heat sink contacting the IHS 202. The illustrative substrate 204 has a width of about 40 millimeters, a length of about 70 millimeters, and a height of 3 millimeters. In other embodiments, the substrate 204 may have any suitable dimensions, such as a length and/or width of 50-200 millimeters and a height of 0.5-20 millimeters.

In some embodiments, the substrate 204 may not extend past the IHS 202 and/or the load plate 108 may not contact the substrate 204. For example, in some embodiments, the heat sink base 104 may have a pedestal that contacts the central region of the IHS 202, and the load plate 108 may contact the edge areas of the IHS 202 to apply a downward force. In other embodiments, the integrated circuit component 118 may not include a separate substrate 204. Rather, the dies or other components inside a package may contact pins 208 on the processor socket 206 directly.

The system board 112 supports the bolster plate 110 and the processor socket 206. The processor socket 206 is configured to mate with the integrated circuit component 118. The illustrative processor socket 206 includes a socket frame 210 with a shape that mates with the shape of the integrated circuit component 118. The socket frame 210 may include features such as one or more notches or protrusions that mate with corresponding features on the integrated circuit component 118 such that the integrated circuit component 118 can only be oriented one way in the processor socket 206.

The processor socket 206 includes several pins 208 that are configured in a pin grid array to mate with a corresponding pad of a land grid array of the integrated circuit component 118. The processor socket 206 may include any suitable number of pins, such as any number from 2-10,000. In the illustrative embodiment, the processor socket 206 may include 1,151, 1,200, 1,331, 2,066, 3,647, or 4,094 pins 208. In the illustrative embodiment, the pins 208 are bent or otherwise in contact with the integrated circuit component 118 such that each pin 208 acts as a small spring, ensuring good electrical contact with the integrated circuit component 118 when an appropriate downward force is applied to the integrated circuit component 118. As a result of acting as a small spring, each pin 208 applies a small upward force to the integrated circuit component 118 that is countered by the downward force applied by the heat sink 102 and the load plate 108. In the illustrative embodiment, each pin 209 may apply 10-15 grams of force (0.022-0.033 pounds of force). Additionally or alternatively, in some embodiments, the processor socket 206 may include a land grid array, a ball grid array, or any other suitable array of connectors to mate with the integrated circuit component 118.

The bolster plate 110 is configured to be fastened to the heat sink 102 and to the load plate 108. The illustrative bolster plate 110 is in turn fastened to or otherwise connected to the system board 112. In the illustrative embodiment, the bolster plate 110 is connected to a backplate 302 on the underside of the system board 112 (see FIG. 3). The bolster plate 110 may be connected to the backplate 302 in any suitable manner, such as with one or more screws, bolts, rivets, etc. In the illustrative embodiment, the heat sink 102 and load plate 108 apply a downward force to the integrated circuit component 118 and apply an equivalent upward force on the bolster plate 110, the back plate 302, and/or the system board 112, which transfers the upward force to the processor socket 110 and the integrated circuit component 118. In some embodiments, the bolster plate 110 may not connect to a back plate 302. For example, the bolster plate 110 may simply connect to the system board 112 or may connect directly to the processor socket 110 to transfer the force from the heat sink 104 and load plate 108 to the pins 208.

The bolster plate 110 may be made of any suitable material. In the illustrative embodiment, the bolster plate 110 is made out of high-strength steel. In other embodiments, the bolster plate 110 may be made out of, e.g., iron, steel, aluminum, ceramic, etc. The bolster plate 110 may have any suitable shape or dimensions. For example, the bolster plate 110 may have a width of 10-250 millimeters, a length of 10-250 millimeters, and/or a height of 1-100 millimeters. In the illustrative embodiment, the bolster plate 110 has a width of about 75 millimeters, a width of about 150 millimeters, and a height of about 3 millimeters.

The illustrative bolster plate 110 has a hole in it that can accommodate the processor socket 206. The size and shape of the hole may be any suitable size and shape, depending on the size and shape of the processor socket 206. In the illustrative embodiment, the hole may have a length of, e.g., 10-240 millimeters and/or a width of 10-240 millimeters. In the illustrative embodiment, the bolster plate 110 has a height that is less than the height of the surface of the integrated circuit component 118 that the load plate 108 contacts, allowing the illustrative load plate 108 to contact the substrate 204 around the IHS 202 without contacting the bolster plate 110.

In the illustrative embodiment, the bolster plate 110 forms a complete loop around the processor socket 206. In other embodiments, the bolster plate 110 may not form a complete loop but rather may be in the shape of a horseshoe, with one end of the bolster plate 110 open. In yet other embodiments, the bolster plate 110 may be split into two or more separate pieces. For example, the bolster plate 110 may be embodied as two rails, each of which mates with the part of the load plate 108 and heat sink 104 above it. In some embodiments, a bolster plate 110 may not be included, and the load plate 108 and the heat sink 104 may fasten directly to the back plate 302.

Similar to the bolster plate 110, the back plate 302 may be made of any suitable material. In the illustrative embodiment, the back plate 302 is made out of high-strength steel. In other embodiments, the back plate 302 may be made out of, e.g., iron, steel, aluminum, ceramic, etc. The back plate 302 may have any suitable shape or dimensions. For example, the back plate 302 may have a width of 10-250 millimeters, a length of 10-250 millimeters, and/or a height of 1-100 millimeters. In the illustrative embodiment, the back plate 302 has a width of about 75 millimeters, a width of about 150 millimeters, and a height of about 3 millimeters.

The illustrative back plate 302 is a solid shape without any holes or gaps, allowing the back plate 302 to evenly apply an upward force to the system board 112 and to the processor socket 206 above the back plate 302. In some embodiments, the back plate 302 may have some holes in it, which may change how force is applied upward to the system board 112.

In the illustrative embodiment, the system board 112 may be embodied as a motherboard of a computer system. The system board 112 may include other components not shown, such as interconnects, other electrical components such as capacitors or resistors, sockets for components such as memory or peripheral cards, connectors for peripherals, etc. In other embodiments, the system board 112 may be form or be a part of another component of a computer system, such as a peripheral card, a mezzanine board, etc. The illustrative system board 112 is a fiberglass board made of glass fibers and a resin, such as FR-4. In other embodiments, other types of circuit boards may be used.

In the illustrative embodiment, heat sink 102 is fastened to the illustrative bolster plate 110 by fasteners 114, and the illustrative load plate 108 is fastened to the illustrative bolster plate 110 by fasteners 116. In the illustrative embodiment, each of fasteners 114 and 116 are embodied as screws or bolts. Fastener 114 has a spring 115 that applies a downward force on the heat sink base 104, and fastener 116 has a spring 117 that applies a downward force on the heat load plate 116. The fasteners 114, 116 can screw directly into threaded holes of the bolster plate 110 or may be secured by, e.g., a nut. Additionally or alternatively, the fasteners 114 and/or 116 may be embodied as any other suitable type of fastener, such as a torsion fastener, a spring screw, one or more clips, a land grid array (LGA) loading mechanism, and/or a combination of any suitable types of fasteners. In the illustrative embodiment, the fasteners 114 and 116 are removable. In other embodiments, some or all of the fasteners 114 and 116 may permanently secure the various components they fasten.

In the illustrative embodiment, the fasteners 114 fastening the heat sink 102 pass through two holes in the heat sink base 104. The illustrative holes are positioned near the middle of a long edge of the heat sink 102, with the hole positioned 1-10 millimeters from the edge. Additionally or alternatively, the fasteners 114 fastening the heat sink 102 to the bolster plate 110 may be positioned at different locations, such as the corners of the heat sink 102. In some embodiments, there may be a different number of fasteners 114, such as 2-8 fasteners.

In the illustrative embodiment, the fasteners 116 fastening the load plate 108 pass through four holes in the load plate 108. The illustrative holes are positioned near the corners of the load plate 108, with the hole positioned 1-10 millimeters from the corners. Additionally or alternatively, the fasteners 118 fastening the load plate 108 to the bolster plate 110 may be positioned at different locations, such as the side of the load plate 108. In some embodiments, there may be a different number of fasteners 116, such as 2-8 fasteners.

Figure 7:
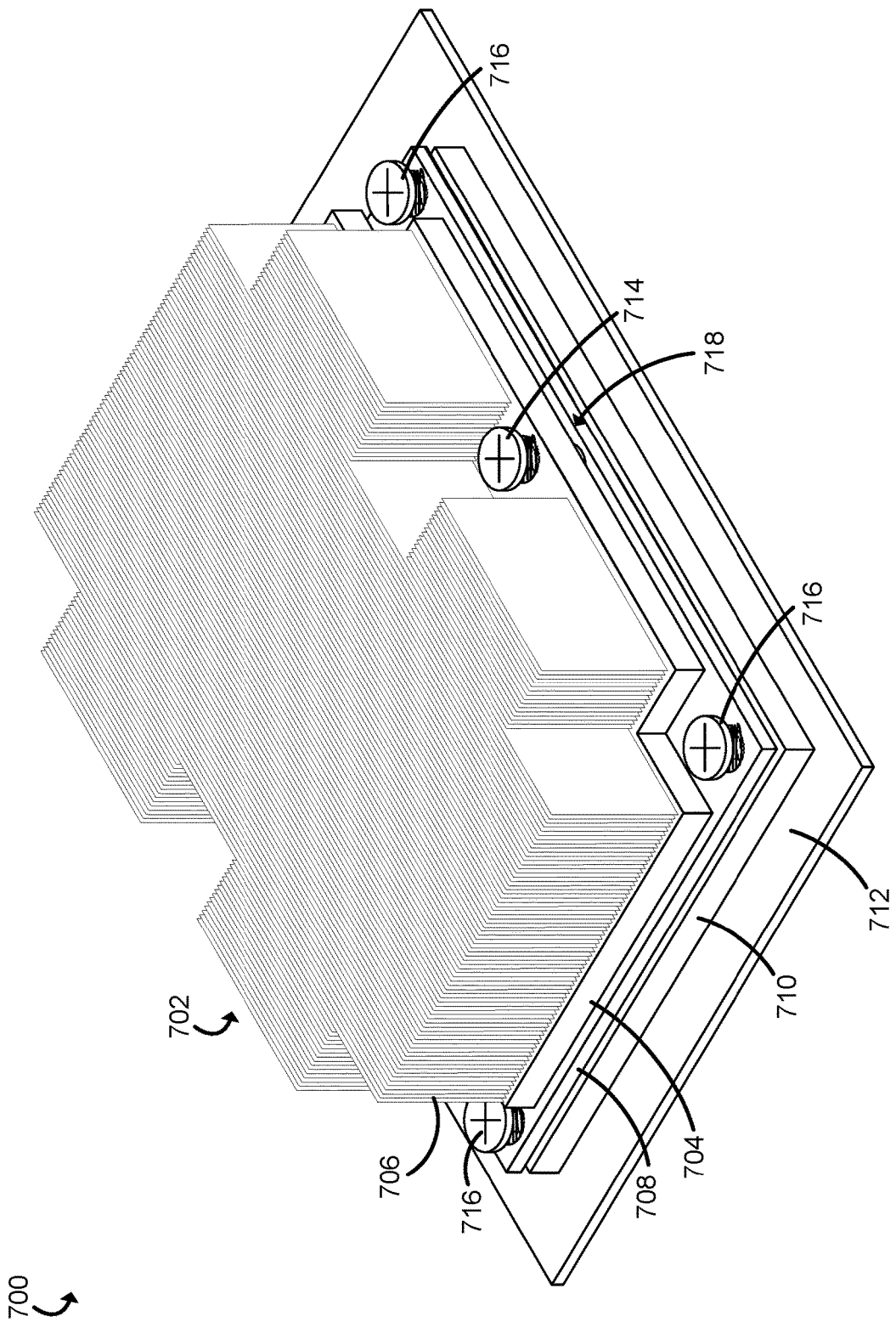
FIG. 7 is a perspective view of a simplified diagram of at least one embodiment of a system with an integrated circuit component and heat sink connected to a system board.
Figure 8:
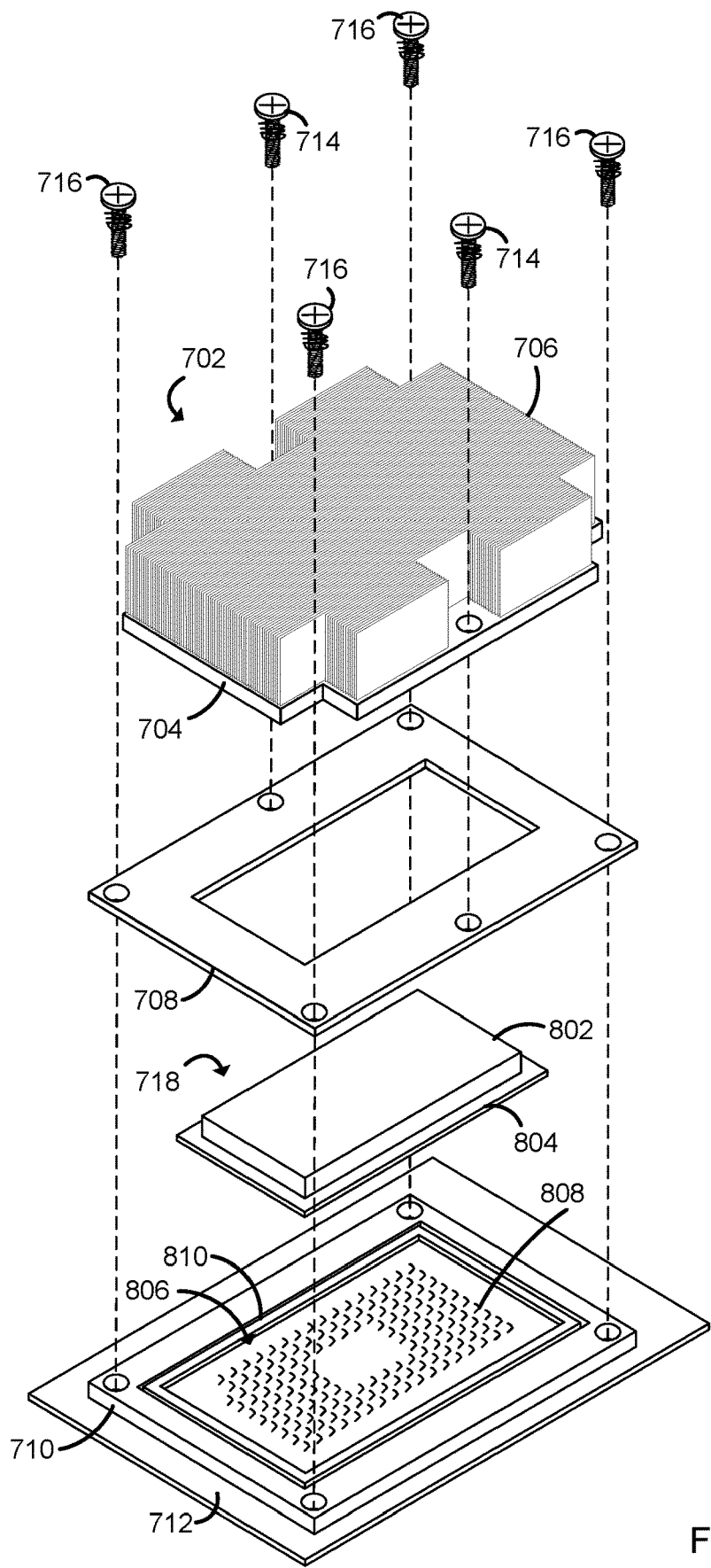
FIG. 8 is an exploded perspective view of simplified diagram of at least one embodiment of the system of FIG. 7.

Referring now to FIGS. 7 & 8, in one embodiment a compute system 700 has a heat sink 702, a load plate 708, and a bolster plate 710. FIG. 7 shows the assembled compute system 700, and FIG. 8 shows an exploded view of the components of FIG. 7. The compute system 700 is similar to the system 100, but, in the compute system 700, the heat sink 702 is fastened to the load plate 708 rather than to the bolster plate 710. It should be appreciated that several of the advantages described above in regard to the system 100 are similarly present in the compute system 700. For example, the force applied to the heat sink base 704 needs to be sufficient to establish strong thermal coupling between the heat sink base 704 and the IHS 802 but does not need to be sufficient to apply the necessary downward force to the integrated circuit component 718 to keep the integrated circuit component 718 in good electrical and mechanical contact with the processor socket 806. Rather, the load plate 708 can apply the necessary downward force to the integrated circuit component 718 to keep the integrated circuit component 718 in good electrical and mechanical contact with the processor socket 806. As for the load plate 108, the load plate 708 does not need to have a high thermal conductivity to absorb heat from the integrated circuit component 718. The heat sink 702 may be fastened to the load plate 708 in any suitable manner, including any mechanism described above for fastening the heat sink 102 to the bolster plate 110, a description of which will not be repeated in the interest of clarity.

The compute system 700 and its components may be similar to the system 100 except for the differences shown in the figures and described herein. For example, the heat sink 702, the heat sink base 704, and heat sink fins 706 may be similar to the corresponding components of the system 100. The bolster plate 708 may be similar to the bolster plate 108. The integrated circuit component 718 (including the IHS 802 and substrate 804) may be similar to the integrated circuit component 118. The system board 712, bolster plate 710, and back plate of the compute system 700 (not shown in FIGS. 7 & 8) may be similar to the corresponding component of the system 100. The processor socket 806, the pins 808, and the socket frame 810 may be similar to the corresponding component of the system 100. A description of each of those components will not be repeated in the interest of clarity.

Figure 9:
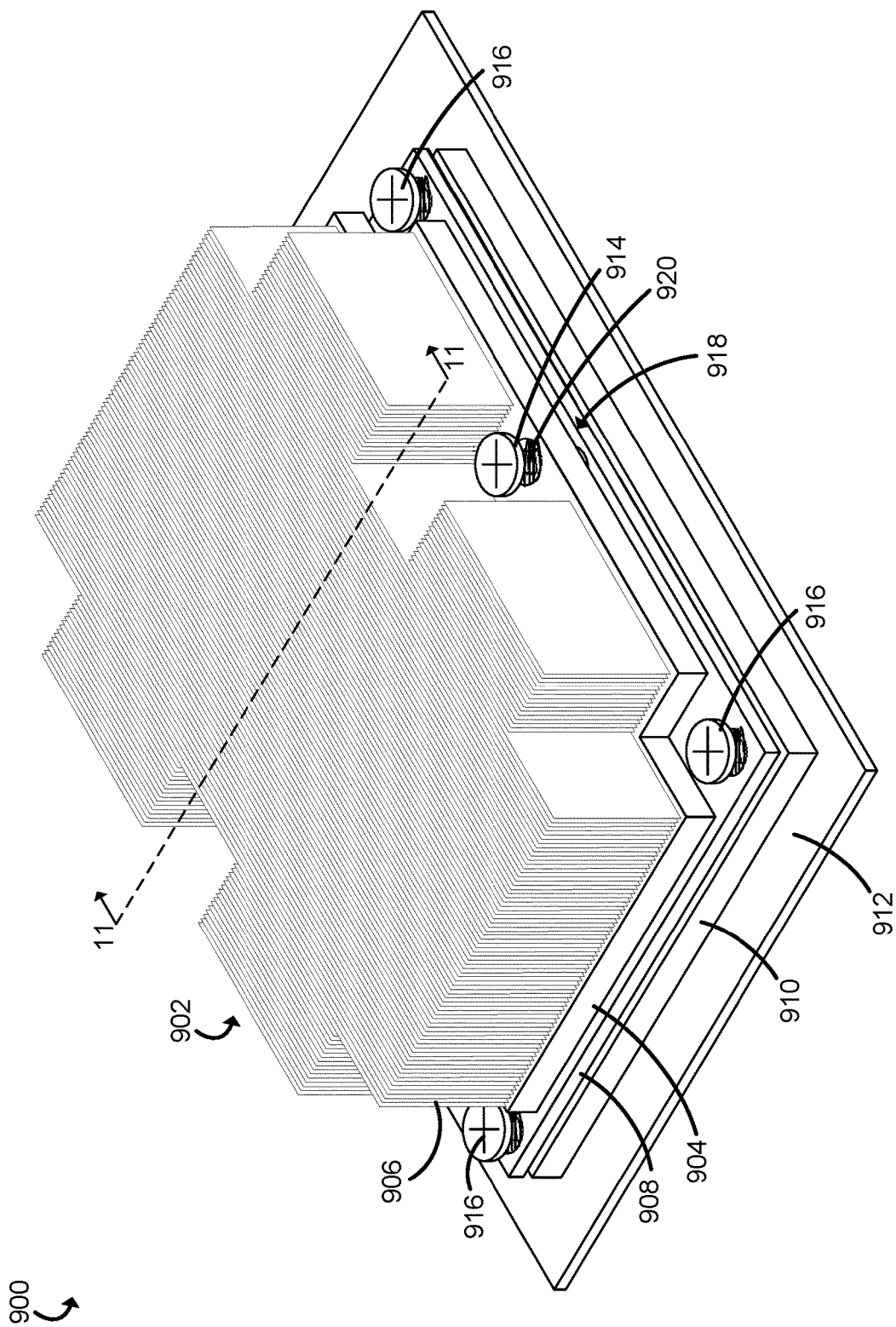
FIG. 9 is a perspective view of a simplified diagram of at least one embodiment of a system with an integrated circuit component and heat sink connected to a system board.
Figure 10:
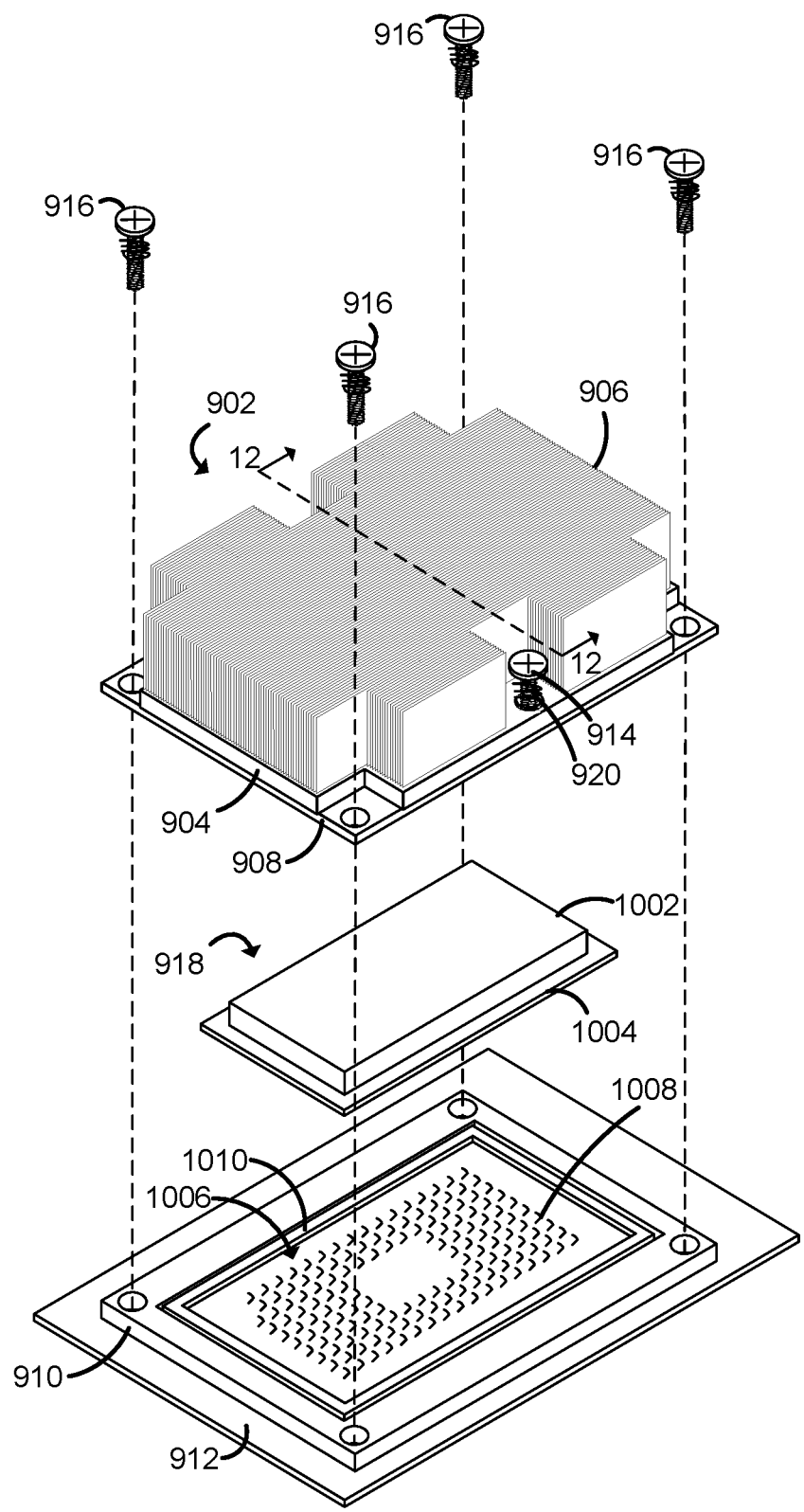
FIG. 10 is an exploded perspective view of simplified diagram of at least one embodiment of the system of FIG. 9.
Figure 11:
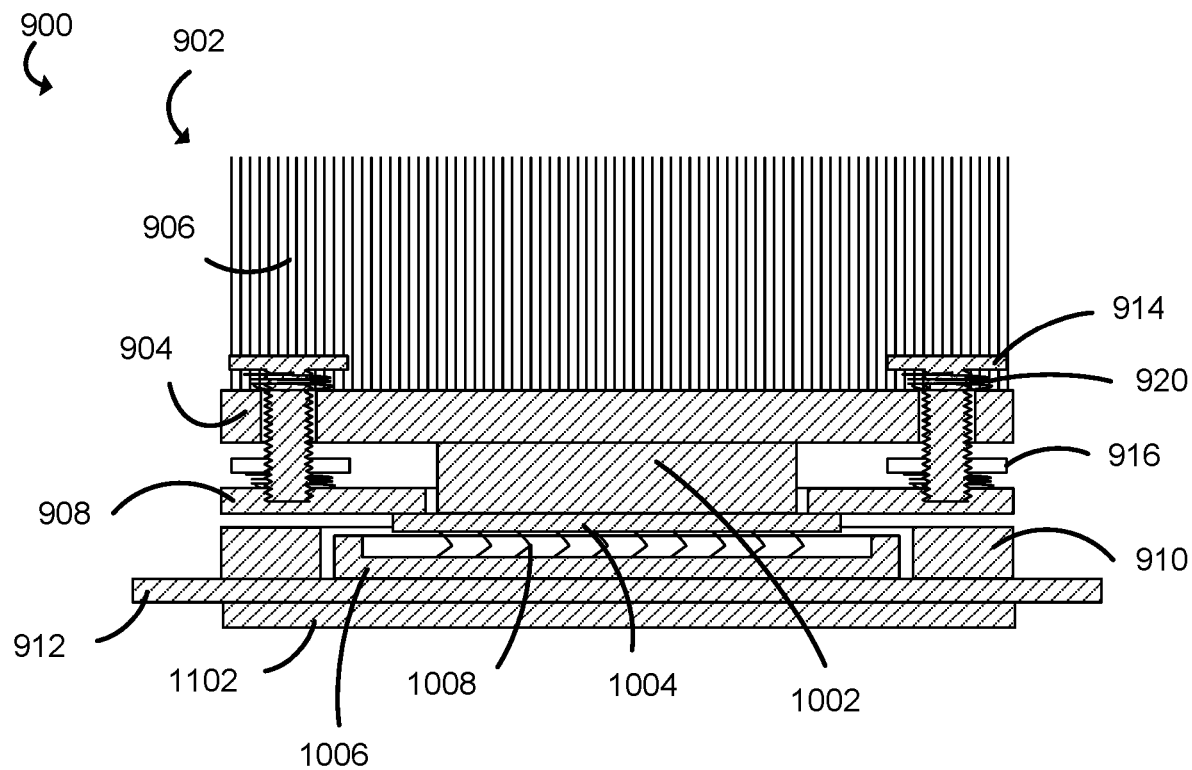
FIG. 11 is a cross-sectional view of the system of FIG. 9.
Figure 12:
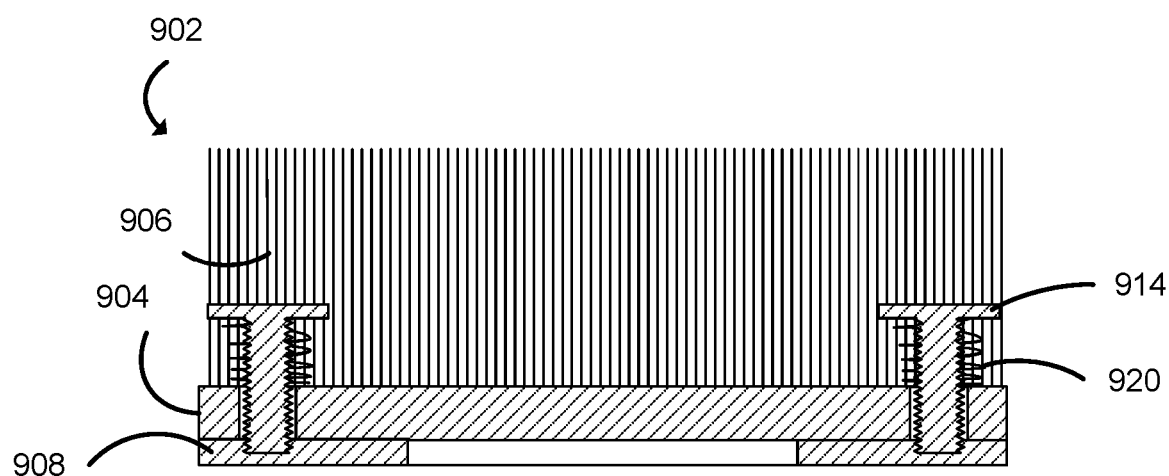
FIG. 12 is a cross-sectional view of the system of FIG. 9.

Referring now to FIGS. 9-12, in one embodiment a compute system 900 has a heat sink 902, a load plate 908, and a bolster plate 910. FIG. 9 shows the assembled compute system 900, and FIG. 10 shows an exploded view of the components of FIG. 9. FIG. 11 shows a cross-sectional view of the assembled compute system 900, and FIG. 12 shows a cross-sectional view of the heat sink 802 and load plate 908 when removed from the rest of the compute system 900.

The compute system 900 is similar to the compute system 700, but, in the compute system 900, the heat sink 902 is fastened to the load plate 908 with a spring 920, such as with spring screws 914. When the heat sink 902 and load plate 908 are installed, with the load plate 908 fastened to the bolster plate 910, the spring 920 is compressed, applying a downward force to the heat sink 902, as shown in FIGS. 9 & 11. When the heat sink 902 and load plate 908 are not installed, the spring 920 raises the load plate 908 closer to the heat sink base 904, as shown in FIGS. 10 & 12. It should be appreciated that, in the illustrative embodiment, when the load plate 908 is installed, the springs 920 automatically apply a downward force to the heat sink 902 that is sufficient to keep the heat sink 902 in strong thermal contact with the integrated circuit component 918. As such, installation of the heat sink 902 and load plate 908 may be simpler than installation of the heat sink 102 and load plate 108.

The heat sink 902 may be mechanically coupled to the load plate 908 with any suitable fastener or spring. In the illustrative embodiment, removable fasteners 914 may be embodied as screws or bolts with an integrated coil spring 920. Additionally or alternatively, in some embodiments, the heat sink 902 may be coupled to the load plate 908 with a different type of spring, such as a leaf spring, a torsion spring, etc. In some embodiments, the heat sink 902 may be permanently fastened or otherwise permanently linked to the load plate 908. In the illustrative embodiment, the force applied by the springs 920 when the heat sink 902 and load plate 908 are installed is not tunable. In other embodiments, the force applied by the springs 920 when the heat sink 902 and load plate 908 are installed may be tunable or otherwise controllable, such as by loosening or tightening a spring screw 920.

The compute system 900 and its components may be similar to the system 100 except for the differences shown in the figures and described herein. For example, the heat sink 902, the heat sink base 904, and heat sink fins 906 may be similar to the corresponding components of the system 100. The bolster plate 908 may be similar to the bolster plate 108. The integrated circuit component 918 (including the IHS 1002 and substrate 1004) may be similar to the integrated circuit component 118. The system board 912, bolster plate 910, and back plate of the compute system 900 (not shown in FIGS. 9 & 8) may be similar to the corresponding component of the system 100. The processor socket 1006, the pins 1008, and the socket frame 1010 may be similar to the corresponding component of the system 100. A description of each of those components will not be repeated in the interest of clarity.

The technologies described herein can be performed by or implemented in any of a variety of computing systems, including mobile computing systems (e.g., smartphones, handheld computers, tablet computers, laptop computers, portable gaming consoles, 2-in-1 convertible computers, portable all-in-one computers), non-mobile computing systems (e.g., desktop computers, servers, workstations, stationary gaming consoles, set-top boxes, smart televisions, rack-level computing solutions (e.g., blades, trays, sleds)), and embedded computing systems (e.g., computing systems that are part of a vehicle, smart home appliance, consumer electronics product or equipment, manufacturing equipment). As used herein, the term "computing system" includes computing devices and includes systems comprising multiple discrete physical components. In some embodiments, the computing systems are located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

Figure 13:
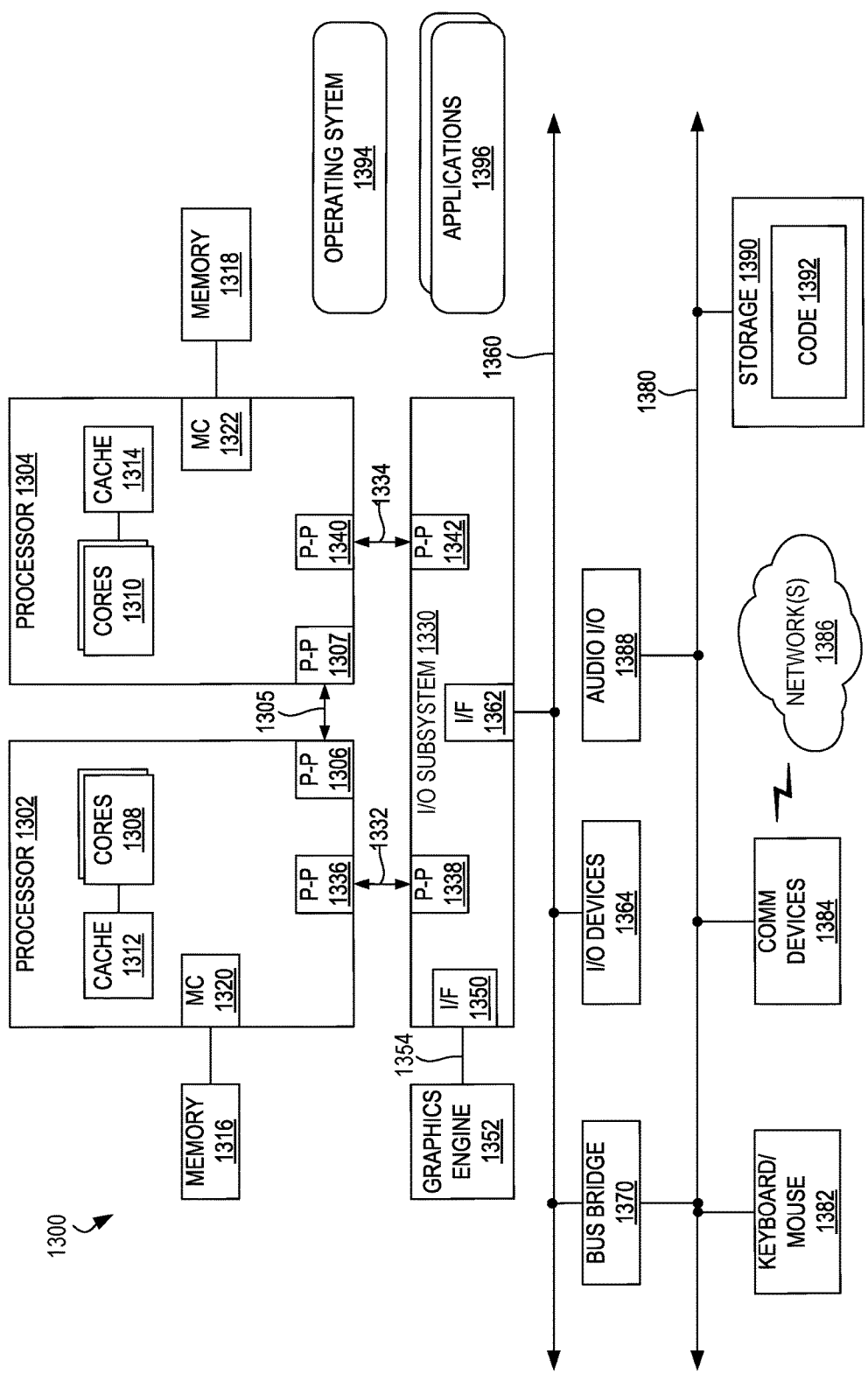
FIG. 13 is a block diagram of an exemplary computing system in which technologies described herein may be implemented.

FIG. 13 is a block diagram of a second example computing system in which technologies described herein may be implemented. Generally, components shown in FIG. 13 can communicate with other shown components, although not all connections are shown, for ease of illustration. The computing system 1300 is a multiprocessor system comprising a first processor unit 1302 and a second processor unit 1304 comprising point-to-point (P-P) interconnects. A point-to-point (P-P) interface 1306 of the processor unit 1302 is coupled to a point-to-point interface 1307 of the processor unit 1304 via a point-to-point interconnection 1305. It is to be understood that any or all of the point-to-point interconnects illustrated in FIG. 13 can be alternatively implemented as a multi-drop bus, and that any or all buses illustrated in FIG. 13 could be replaced by point-to-point interconnects.

The processor units 1302 and 1304 comprise multiple processor cores. Processor unit 1302 comprises processor cores 1308 and processor unit 1304 comprises processor cores 1310. Processor cores 1308 and 1310 can execute computer-executable instructions in a manner similar to that discussed below in connection with FIG. 14, or other manners.

Processor units 1302 and 1304 further comprise cache memories 1312 and 1314, respectively. The cache memories 1312 and 1314 can store data (e.g., instructions) utilized by one or more components of the processor units 1302 and 1304, such as the processor cores 1308 and 1310. The cache memories 1312 and 1314 can be part of a memory hierarchy for the computing system 1300. For example, the cache memories 1312 can locally store data that is also stored in a memory 1316 to allow for faster access to the data by the processor unit 1302. In some embodiments, the cache memories 1312 and 1314 can comprise multiple cache levels, such as level 1 (L1), level 2 (L2), level 3 (L3), level 4 (L4), and/or other caches or cache levels, such as a last level cache (LLC). Some of these cache memories (e.g., L2, L3, L4, LLC) can be shared among multiple cores in a processor unit. One or more of the higher levels of cache levels (the smaller and faster caches) in the memory hierarchy can be located on the same integrated circuit die as a processor core and one or more of the lower cache levels (the larger and slower caches) can be located on an integrated circuit dies that are physically separate from the processor core integrated circuit dies.

Although the computing system 1300 is shown with two processor units, the computing system 1300 can comprise any number of processor units. Further, a processor unit can comprise any number of processor cores. A processor unit can take various forms such as a central processing unit (CPU), a graphics processing unit (GPU), general-purpose GPU (GPGPU), accelerated processing unit (APU), field-programmable gate array (FPGA), neural network processing unit (NPU), data processor unit (DPU), accelerator (e.g., graphics accelerator, digital signal processor (DSP), compression accelerator, artificial intelligence (AI) accelerator), controller, or other types of processing units. As such, the processor unit can be referred to as an XPU (or xPU). Further, a processor unit can comprise one or more of these various types of processing units. In some embodiments, the computing system comprises one processor unit with multiple cores, and in other embodiments, the computing system comprises a single processor unit with a single core. As used herein, the terms "processor unit" and "processing unit" can refer to any processor, processor core, component, module, engine, circuitry, or any other processing element described or referenced herein.

In some embodiments, the computing system 1300 can comprise one or more processor units that are heterogeneous or asymmetric to another processor unit in the computing system. There can be a variety of differences between the processing units in a system in terms of a spectrum of metrics of merit including architectural, microarchitectural, thermal, power consumption characteristics, and the like. These differences can effectively manifest themselves as asymmetry and heterogeneity among the processor units in a system.

The processor units 1302 and 1304 can be located in a single integrated circuit component (such as a multi-chip package (MCP) or multi-chip module (MCM)) or they can be located in separate integrated circuit components. An integrated circuit component comprising one or more processor units can comprise additional components, such as embedded DRAM, stacked high bandwidth memory (HBM), shared cache memories (e.g., L3, L4, LLC), input/output (I/O) controllers, or memory controllers. Any of the additional components can be located on the same integrated circuit die as a processor unit, or on one or more integrated circuit dies separate from the integrated circuit dies comprising the processor units. In some embodiments, these separate integrated circuit dies can be referred to as "chiplets". In some embodiments where there is heterogeneity or asymmetry among processor units in a computing system, the heterogeneity or asymmetric can be among processor units located in the same integrated circuit component.

Processor units 1302 and 1304 further comprise memory controller logic (MC) 1320 and 1322. As shown in FIG. 13, MCs 1320 and 1322 control memories 1316 and 1318 coupled to the processor units 1302 and 1304, respectively. The memories 1316 and 1318 can comprise various types of volatile memory (e.g., dynamic random-access memory (DRAM), static random-access memory (SRAM)) and/or non-volatile memory (e.g., flash memory, chalcogenide-based phase-change non-volatile memories), and comprise one or more layers of the memory hierarchy of the computing system. While MCs 1320 and 1322 are illustrated as being integrated into the processor units 1302 and 1304, in alternative embodiments, the MCs can be external to a processor unit.

Processor units 1302 and 1304 are coupled to an Input/Output (I/O) subsystem 1330 via point-to-point interconnections 1332 and 1334. The point-to-point interconnection 1332 connects a point-to-point interface 1336 of the processor unit 1302 with a point-to-point interface 1338 of the I/O subsystem 1330, and the point-to-point interconnection 1334 connects a point-to-point interface 1340 of the processor unit 1304 with a point-to-point interface 1342 of the I/O subsystem 1330. Input/Output subsystem 1330 further includes an interface 1350 to couple the I/O subsystem 1330 to a graphics engine 1352. The I/O subsystem 1330 and the graphics engine 1352 are coupled via a bus 1354.

The Input/Output subsystem 1330 is further coupled to a first bus 1360 via an interface 1362. The first bus 1360 can be a Peripheral Component Interconnect Express (PCIe) bus or any other type of bus. Various I/O devices 1364 can be coupled to the first bus 1360. A bus bridge 1370 can couple the first bus 1360 to a second bus 1380. In some embodiments, the second bus 1380 can be a low pin count (LPC) bus. Various devices can be coupled to the second bus 1380 including, for example, a keyboard/mouse 1382, audio I/O devices 1388, and a storage device 1390, such as a hard disk drive, solid-state drive, or another storage device for storing computer-executable instructions (code) 1392 or data. The code 1392 can comprise computer-executable instructions for performing methods described herein. Additional components that can be coupled to the second bus 1380 include communication device(s) 1384, which can provide for communication between the computing system 1300 and one or more wired or wireless networks 1386 (e.g. Wi-Fi, cellular, or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

In embodiments where the communication devices 1384 support wireless communication, the communication devices 1384 can comprise wireless communication components coupled to one or more antennas to support communication between the computing system 1300 and external devices. The wireless communication components can support various wireless communication protocols and technologies such as Near Field Communication (NFC), IEEE 1002.11 (Wi-Fi) variants, WiMax, Bluetooth, Zigbee, 4G Long Term Evolution (LTE), Code Division Multiplexing Access (CDMA), Universal Mobile Telecommunication System (UMTS) and Global System for Mobile Telecommunication (GSM), and 5G broadband cellular technologies. In addition, the wireless modems can support communication with one or more cellular networks for data and voice communications within a single cellular network, between cellular networks, or between the computing system and a public switched telephone network (PSTN).

The system 1300 can comprise removable memory such as flash memory cards (e.g., SD (Secure Digital) cards), memory sticks, Subscriber Identity Module (SIM) cards). The memory in system 1300 (including caches 1312 and 1314, memories 1316 and 1318, and storage device 1390) can store data and/or computer-executable instructions for executing an operating system 1394 and application programs 1396. Example data includes web pages, text messages, images, sound files, and video data to be sent to and/or received from one or more network servers or other devices by the system 1300 via the one or more wired or wireless networks 1386, or for use by the system 1300. The system 1300 can also have access to external memory or storage (not shown) such as external hard drives or cloud-based storage.

The operating system 1394 can control the allocation and usage of the components illustrated in FIG. 13 and support the one or more application programs 1396. The application programs 1396 can include common computing system applications (e.g., email applications, calendars, contact managers, web browsers, messaging applications) as well as other computing applications.

The computing system 1300 can support various additional input devices, such as a touchscreen, microphone, monoscopic camera, stereoscopic camera, trackball, touchpad, trackpad, proximity sensor, light sensor, electrocardiogram (ECG) sensor, PPG (photoplethysmogram) sensor, galvanic skin response sensor, and one or more output devices, such as one or more speakers or displays. Other possible input and output devices include piezoelectric and other haptic I/O devices. Any of the input or output devices can be internal to, external to, or removably attachable with the system 1300. External input and output devices can communicate with the system 1300 via wired or wireless connections.

In addition, the computing system 1300 can provide one or more natural user interfaces (NUIs). For example, the operating system 1394 or applications 1396 can comprise speech recognition logic as part of a voice user interface that allows a user to operate the system 1300 via voice commands. Further, the computing system 1300 can comprise input devices and logic that allows a user to interact with computing the system 1300 via body, hand or face gestures.

The system 1300 can further include at least one input/output port comprising physical connectors (e.g., USB, IEEE 1394 (FireWire), Ethernet, RS-232), a power supply (e.g., battery), a global satellite navigation system (GNSS) receiver (e.g., GPS receiver); a gyroscope; an accelerometer; and/or a compass. A GNSS receiver can be coupled to a GNSS antenna. The computing system 1300 can further comprise one or more additional antennas coupled to one or more additional receivers, transmitters, and/or transceivers to enable additional functions.

It is to be understood that FIG. 13 illustrates only one example computing system architecture. Computing systems based on alternative architectures can be used to implement technologies described herein. For example, instead of the processors 1302 and 1304 and the graphics engine 1352 being located on discrete integrated circuits, a computing system can comprise an SoC (system-on-a-chip) integrated circuit incorporating multiple processors, a graphics engine, and additional components. Further, a computing system can connect its constituent component via bus or point-to-point configurations different from that shown in FIG. 13. Moreover, the illustrated components in FIG. 13 are not required or all-inclusive, as shown components can be removed and other components added in alternative embodiments.

Figure 14:
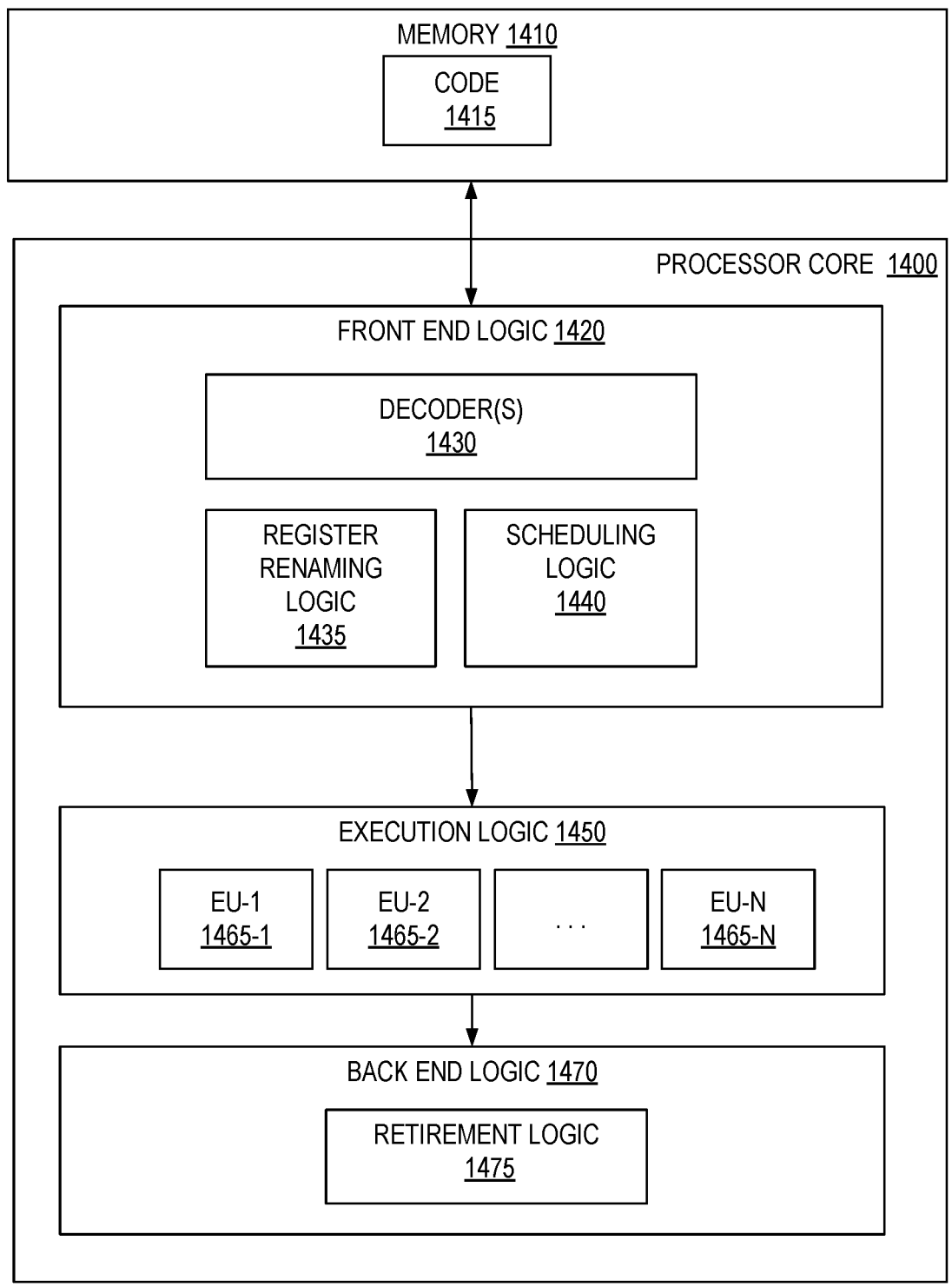
FIG. 14 is a block diagram of an exemplary processor unit that can execute instructions as part of implementing technologies described herein.

FIG. 14 is a block diagram of an example processor unit 1400 to execute computer-executable instructions as part of implementing technologies described herein. The processor unit 1400 can be a single-threaded core or a multithreaded core in that it may include more than one hardware thread context (or "logical processor") per processor unit.

FIG. 14 also illustrates a memory 1410 coupled to the processor unit 1400. The memory 1410 can be any memory described herein or any other memory known to those of skill in the art. The memory 1410 can store computer-executable instructions 1415 (code) executable by the processor core 1400.

The processor unit comprises front-end logic 1420 that receives instructions from the memory 1410. An instruction can be processed by one or more decoders 1430. The decoder 1430 can generate as its output a micro-operation such as a fixed width micro operation in a predefined format, or generate other instructions, microinstructions, or control signals, which reflect the original code instruction. The front-end logic 1420 further comprises register renaming logic 1435 and scheduling logic 1440, which generally allocate resources and queues operations corresponding to converting an instruction for execution.

The processor unit 1400 further comprises execution logic 1450, which comprises one or more execution units (EUs) 1465-1 through 1465-N. Some processor unit embodiments can include a number of execution units dedicated to specific functions or sets of functions. Other embodiments can include only one execution unit or one execution unit that can perform a particular function. The execution logic 1450 performs the operations specified by code instructions. After completion of execution of the operations specified by the code instructions, back-end logic 1470 retires instructions using retirement logic 1475. In some embodiments, the processor unit 1400 allows out of order execution but requires in-order retirement of instructions. Retirement logic 1475 can take a variety of forms as known to those of skill in the art (e.g., re-order buffers or the like).

The processor unit 1400 is transformed during execution of instructions, at least in terms of the output generated by the decoder 1430, hardware registers and tables utilized by the register renaming logic 1435, and any registers (not shown) modified by the execution logic 1450.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. As used in any embodiment herein, the term "circuitry" can comprise, for example, singly or in any combination, hardwired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry. A computing system referred to as being programmed to perform a method can be programmed to perform the method via software, hardware, firmware or combinations thereof.

Any of the disclosed methods can be implemented as computer-executable instructions or a computer program product. Such instructions can cause a computer or one or more processor units capable of executing computer-executable instructions to perform any of the disclosed methods. Generally, as used herein, the term "computer" refers to any computing device or system described or mentioned herein, or any other computing device. Thus, the term "computer-executable instruction" refers to instructions that can be executed by any computing device described or mentioned herein, or any other computing device.

The computer-executable instructions or computer program products as well as any data created and used during implementation of the disclosed technologies can be stored on one or more tangible or non-transitory computer-readable storage media, such as optical media discs (e.g., DVDs, CDs), volatile memory components (e.g., DRAM, SRAM), or non-volatile memory components (e.g., flash memory, solid-state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, Python, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed through a suitable communication means. Such suitable communication means include, for example, the Internet, the World Wide Web, an intranet, cable (including fiber optic cable), magnetic communications, electromagnetic communications (including RF, microwave, and infrared communications), electronic communications, or other such communication means.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrase "at least one of A, B or C" can mean A; B; C; A and B; A and C; B and C; or A, B and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

EXAMPLES

Illustrative examples of the technologies disclosed herein are provided below. An embodiment of the technologies may include any one or more, and any combination of, the examples described below.

Example 1 includes a system comprising a mainboard comprising a processor socket and a bolster plate; an integrated circuit component physically coupled to the processor socket; a heat sink in contact with a surface of the integrated circuit component; and a load plate in contact with the integrated circuit component, wherein the load plate is fastened to the bolster plate with one or more fasteners, wherein the heat sink and the load plate apply a downward force on the integrated circuit component to press the integrated circuit component into the processor socket.

Example 2 includes the subject matter of Example 1, and wherein the heat sink comprises a rectangular heat sink base, wherein the heat sink is fastened to the bolster plate with one or more additional fasteners, wherein each fastener fastening the heat sink to the bolster plate is positioned near the middle of an edge of the rectangular heat sink base.

Example 3 includes the subject matter of any of Examples 1 and 2, and wherein the heat sink comprises a rectangular heat sink base wherein the heat sink is fastened to the load plate with one or more additional fasteners, wherein each fastener fastening the heat sink to the load plate is positioned near the middle of an edge of the rectangular heat sink base.

Example 4 includes the subject matter of any of Examples 1-3, and wherein the heat sink is fastened to the load plate with one or more springs, wherein the one or more springs apply a downward force on the heat sink that is transferred to the integrated circuit component.

Example 5 includes the subject matter of any of Examples 1-4, and wherein the load plate applies a downward force to the integrated circuit component of at least one hundred pounds.

Example 6 includes the subject matter of any of Examples 1-5, and wherein the load plate applies at least 50% of the downward force applied to the integrated circuit component by the load plate and the heat sink.

Example 7 includes the subject matter of any of Examples 1-6, and wherein the processor socket comprises at least one thousand pins.

Example 8 includes the subject matter of any of Examples 1-7, and wherein the load plate is a steel load plate.

Example 9 includes the subject matter of any of Examples 1-8, and further including a back plate on an underside of the mainboard, wherein the bolster plate is fastened to the back plate.

Example 10 includes the subject matter of any of Examples 1-9, and wherein the integrated circuit component comprises an integrated heat spreader, wherein the heat sink is in contact with a surface of the integrated heat spreader of the integrated circuit component.

Example 11 includes an apparatus comprising a heat sink configured to be in contact with a surface of a integrated circuit component, the heat sink to absorb heat from the integrated circuit component; and a load plate configured to be positioned between the heat sink and the integrated circuit component, wherein the load plate is to be in contact with the integrated circuit component and fastened to a bolster plate of a mainboard; wherein the heat sink and the load plate are configured to simultaneously apply a downward force on the integrated circuit component to press the integrated circuit component into a processor socket of the mainboard when the load plate is fastened to the bolster plate and the heat sink is in contact with the surface of the integrated circuit component.

Example 12 includes the subject matter of Example 11, and wherein the heat sink is fastened to the bolster plate with one or more additional fasteners.

Example 13 includes the subject matter of any of Examples 11 and 12, and wherein the heat sink is fastened to the load plate with one or more additional fasteners.

Example 14 includes the subject matter of any of Examples 11-13, and wherein the heat sink is fastened to the load plate with one or more springs, wherein the one or more springs apply a downward force on the heat sink that is transferred to the integrated circuit component.

Example 15 includes the subject matter of any of Examples 11-14, and wherein the load plate applies a downward force to the integrated circuit component of at least one hundred pounds.

Example 16 includes the subject matter of any of Examples 11-15, and wherein the load plate applies at least 50% of the downward force applied to the integrated circuit component by the load plate and the heat sink.

Example 17 includes the subject matter of any of Examples 11-16, and wherein the load plate is a steel load plate.

Example 18 includes an apparatus comprising heat sink means for absorbing heat from an integrated circuit component and for applying a downward force on the integrated circuit component; and loading means for applying a downward force on the integrated circuit component simultaneously with the heat sink means.

Example 19 includes the subject matter of Example 18, and wherein the loading means applies a downward force to the integrated circuit component of at least one hundred pounds.

Example 20 includes the subject matter of any of Examples 18 and 19, and wherein the loading means applies at least 50% of the downward force applied to the integrated circuit component by the loading means and the heat sink means.

Example 21 includes a system comprising the apparatus of claim 18, the system further comprising a mainboard comprising a processor socket; an integrated circuit component physically coupled to the processor socket; wherein the heat sink means and the loading means apply a downward force on the integrated circuit component to press the integrated circuit component into the processor socket.

Example 22 includes a method comprising positioning a load plate on top of a processor in a processor socket of a main board of a compute device; fastening the load plate to the main board to apply a first downward force on the processor; positioning a heat sink on top of the processor such that the heat sink is in contact with a surface of the processor, the heat sink configured to absorb heat from the processor; and mechanically coupling the heat sink to the main board to apply a second downward force on the processor.

Example 23 includes the subject matter of Example 22, and wherein mechanically coupling the heat sink to the main board comprises fastening the heat sink to a bolster plate of the main board with one or more fasteners.

Example 24 includes the subject matter of any of Examples 22 and 23, and wherein mechanically coupling the heat sink to the main board comprises fastening the heat sink to the load plate of the main board with one or more fasteners.

Example 25 includes the subject matter of any of Examples 22-24, and wherein mechanically coupling the heat sink to the main board comprises fastening the heat sink to the load plate of the main board with one or more springs, wherein the one or more springs apply a downward force on the heat sink that is transferred to the processor.

Example 26 includes the subject matter of any of Examples 22-25, and wherein the load plate applies a downward force to the processor of at least one hundred pounds.

Example 27 includes the subject matter of any of Examples 22-26, and wherein the load plate applies at least 50% of the downward force applied to the processor by the load plate and the heat sink.

Example 28 includes the subject matter of any of Examples 22-27, and wherein the processor socket comprises at least one thousand pins.

Example 29 includes the subject matter of any of Examples 22-28, and wherein the load plate is a steel load plate.

Example 30 includes the subject matter of any of Examples 22-29, and wherein the main board comprises a back plate on an underside of the mainboard, wherein the bolster plate is fastened to the back plate.

The invention claimed is:

1. A system comprising:
a mainboard including a processor socket and a bolster plate;
an integrated circuit component physically coupled to the processor socket;
a heat sink including a heat sink base in contact with a surface of the integrated circuit component, the heat sink base including a perimeter and a thickness that extends from a first surface of the heat sink base to a second surface of the heat sink base, the second surface opposite the first surface, the heat sink base including a cut out defining a portion of the perimeter of the heat sink base, the cut out extending through the thickness; and
a load plate in contact with the integrated circuit component, the load plate fastened to the bolster plate with a fastener positioned in an area defined by the cut out, the heat sink and the load plate to apply a force on the integrated circuit component to press the integrated circuit component into the processor socket.

2. The system of claim 1, wherein the heat sink base includes a first edge, a second edge opposite the first edge, and a third edge extending between the first edge and the second edge, and the heat sink is fastened to the bolster plate with an additional fastener, the additional fastener positioned closer to a middle of the third edge than to the first edge and to the second edge.

3. The system of claim 1, wherein the heat sink base includes a first edge, a second edge opposite the first edge, and a middle defined equidistant between the first edge and the second edge, and the heat sink is fastened to the load plate with an additional fastener, the middle being closer to the additional fastener than each of the first edge and the second edge is to the additional fastener.

4. The system of claim 1, wherein the heat sink is fastened to the load plate with one or more springs, the one or more springs to apply a force on the heat sink that is transferred to the integrated circuit component.

5. The system of claim 1, wherein the load plate applies a force to the integrated circuit component of at least one hundred pounds.

6. The system of claim 1, wherein the load plate applies at least 50% of the force applied to the integrated circuit component by the load plate and the heat sink.

7. The system of claim 1, wherein the processor socket includes at least one thousand pins.

8. The system of claim 1, wherein the load plate is a steel load plate.

9. The system of claim 1, further including a back plate on an underside of the mainboard, the bolster plate fastened to the back plate.

10. The system of claim 1, wherein the integrated circuit component includes an integrated heat spreader, and the heat sink base is in contact with a surface of the integrated heat spreader.

* * * * *